United States Patent
Mou et al.

(10) Patent No.: US 11,239,424 B2
(45) Date of Patent: Feb. 1, 2022

(54) POLYMER AND METHOD FOR PREPARING THE SAME, ELECTRON INJECTION LAYER, OLED DEVICE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xin Mou, Beijing (CN); Wenbiao Ding, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 235 days.

(21) Appl. No.: 16/408,637

(22) Filed: May 10, 2019

(65) Prior Publication Data
US 2020/0091434 A1 Mar. 19, 2020

(30) Foreign Application Priority Data

Sep. 17, 2018 (CN) .......................... 201811082226.5

(51) Int. Cl.
*H01L 51/00* (2006.01)
*C08G 61/12* (2006.01)
(Continued)

(52) U.S. Cl.
CPC ........ *H01L 51/0036* (2013.01); *C08G 61/126* (2013.01); *C09D 11/102* (2013.01); *C09D 11/30* (2013.01); *C09D 11/52* (2013.01); *H01L 51/0005* (2013.01); *H01L 51/0043* (2013.01); *H01L 51/56* (2013.01); *C08G 2261/124* (2013.01); *C08G 2261/145* (2013.01);
(Continued)

(58) Field of Classification Search
CPC ............. H01L 51/0036; H01L 51/0005; H01L 51/0043; H01L 51/56; H01L 51/5092; H01L 51/558; C08G 61/126; C08G 2261/124; C08G 2261/145; C08G 2261/18; C08G 2261/228; C08G 2261/312; C08G 2261/3223; C08G 2261/411; C08G 2261/514; C08G 2261/95; C09D 11/102; C09D 11/30; C09D 11/52
See application file for complete search history.

(56) References Cited

U.S. PATENT DOCUMENTS

2006/0124908 A1* 6/2006 Maruyama ........... C08G 61/126
252/500
2020/0055993 A1* 2/2020 Noguchi ................. C08L 83/14

FOREIGN PATENT DOCUMENTS

CN 107230747 A 10/2017

* cited by examiner

*Primary Examiner* — Shane Fang
(74) *Attorney, Agent, or Firm* — Kinney & Lange, P.A.

(57) ABSTRACT

A polymer for an electron injection layer, an electron injection layer, an OLED device, and a display device are disclosed. The polymer includes a unit A and a unit B, in which the unit A is an aromatic group; and the unit B is a group represented by one of six possible formulae disclosed herein. The electron injection layer includes the polymer. The OLED device includes an anode, a hole injection layer, a hole transport layer, a light-emitting layer, an electron transport layer, the electron injection layer, and a cathode stacked in sequence.

17 Claims, 2 Drawing Sheets

(51) Int. Cl.
  *C09D 11/102* (2014.01)
  *C09D 11/30* (2014.01)
  *C09D 11/52* (2014.01)
  *H01L 51/56* (2006.01)
  *H01L 51/50* (2006.01)

(52) U.S. Cl.
  CPC ... *C08G 2261/18* (2013.01); *C08G 2261/228* (2013.01); *C08G 2261/312* (2013.01); *C08G 2261/3223* (2013.01); *C08G 2261/411* (2013.01); *C08G 2261/514* (2013.01); *C08G 2261/95* (2013.01); *H01L 51/5092* (2013.01); *H01L 2251/558* (2013.01)

POLYMER AND METHOD FOR PREPARING THE SAME, ELECTRON INJECTION LAYER, OLED DEVICE AND DISPLAY DEVICE

CROSS-REFERENCE TO RELATED APPLICATION

This application claims a priority to Chinese Patent Application No. 201811082226.5 filed on Sep. 17, 2018, which is incorporated in its entirety by reference herein.

TECHNICAL FIELD

The present disclosure discloses relates to the field of display, in particular to a polymer and a method for preparing the same, an electron injection layer, an OLED device and display device

BACKGROUND

As compared with LCDs, organic light-emitting diode (OLED) devices are a new generation of display devices with self-luminous, fast response, wide viewing angle, high brightness, colorful, thin and light.

At present, the mainstream OLED manufacturing technology is to sublime the organic material by heating it in a vacuum chamber, and then to deposit it on an array substrate. This manufacturing technique requires not only a chamber with a high vacuum, but also a fine metal mask (FMM) for the preparation of RGB sub-pixels. Moreover, due to the manufacturing technology has high equipment cost maintenance, low material utilization rate (10% to 20%), and is difficult to be made in big size, it is suitable for preparation of small-sized OLED.

Ink-jet printing (IJP) technology or spin coating technology has potential applications in the preparation of various functional layers of OLED devices, as well as of large-size OLED displays. In particular, ink-jet printing technology, due to its high material utilization, is considered to be a key technology to solve the cost problem of large-size OLED displays. In addition, as compared with the conventional vacuum evaporation process, ink-jet printing technology has many advantages in the preparation of various functional layers of the OLED device, such as mild process conditions, large size, and uniform film formation.

However, due to material limitations, current ink-jet printing or spin coating techniques can print a hole injection layer, a hole transport layer, a light-emitting layer, or even an electron transport layer, but cannot print an electron injection layer. The current electron injection layer is mainly composed of an alkali metal fluoride, such as LiF, an alkali metal compound $Cs_2CO_3$, or a low work function metal, such as Yb or Tm. The electron injection layer is usually prepared from these materials using a vacuum evaporation method. However, the high vapor deposition temperature is not conducive to reducing the manufacturing cost.

SUMMARY

In one aspect, the present disclosure provides a polymer including a unit A and a unit B, in which the unit A is an aromatic group; and the unit B is a group represented by any of formulae (1) to (6):

(1)

(2)

(3)

(4)

(5)

(6)

the polymer independently includes 1 to 100 the units A and 1 to 100 the units B, and the $R_1$ is H or acyloxy, and $R_2$, $R_3$ and $R_4$ are each independently selected from hydrogen, a linear or branched alkyl having 1 to 24 carbon atoms, or a linear or branched alkoxy having 1 to 24 carbon atoms.

Optionally, the unit A is oxazolylene, quinolylidene, anthrylene, diazaanthrylene, pyridylene, thienylene, furylene, pyrrolylene, phenylene, benzopyranylene, benzoxazolylene, benzothylene or isoquinolylene.

Optionally, the unit A is a thienylene group, and $R_1$, $R_2$, $R_3$ and $R_4$ are all hydrogen.

In another aspect, the present disclosure provides a method for preparing the above polymer, including steps of: conducting a Suzuki reaction between aromatic dihalide and any of the compounds represented by the following formulae (7) to (12), to achieve the polymer of the above technical solution; or conducting a Suzuki reaction between any of the compounds represented by the following formulae (13) to

(18) and an aromatic diborate or aromatic diboric acid, to achieve the polymer of the above technical solution;

(7)

(8)

(9)

(10)

(11)

(12)

(13)

-continued (14)

(15)

(16)

(17)

(18)

in which the $R_1$ is H or acyloxy; $R_2$, $R_3$ and $R_4$ are each independently selected from hydrogen, a linear or branched alkyl having 1 to 24 carbon atoms, or a linear or branched alkoxy having 1 to 24 carbon atoms; $R_5$ is a borate group or borate ion; and the X is halogen.

Optionally, the step specifically includes: uniformly mixing aromatic dihalide, any of the compounds represented by the formulae (7) to (12) and a base in a solvent, to conduct a Suzuki reaction under the effect of a palladium catalyst; followed by concentrating and separating to achieve the polymer of the above technical solution; or uniformly mixing any of the compounds represented by the formulae (13) to (18), an aromatic diborate or aromatic diboric acid, and a base in a solvent, to conduct a Suzuki reaction under the effect of a palladium catalyst; followed by concentrating and separating to achieve the polymer of the above technical solution.

Optionally, in the step of uniformly mixing aromatic dihalide, any of the compounds represented by the formulae (7) to (12) and the base in a solvent, one or more of any of the compounds represented by the formulae (13) to (18), the aromatic diborate and the aromatic diboronic acid are further added; or in the step of uniformly mixing any of the compounds represented by the formulae (13) to (18), the aromatic diborate or the aromatic diboric acid and the base in the solvent, one or more of any of the compounds represented by the formulae (7) to (12) and aromatic dihalide are further added.

In yet another aspect, the present disclosure provides an electron injection layer including the above polymer or the polymer prepared by the above method.

In another aspect, the present disclosure provides a OLED device including an anode, a hole injection layer, a hole transport layer, a light-emitting layer, an electron transport layer, the electron injection layer of the above technical solution, and a cathode stacked in sequence.

Optionally, the electron injection layer has a thickness of 0.1 to 20 nm.

Optionally, the cathode is a metal electrode, and a metal-sulfur bond is formed between the electron injection layer and the metal electrode.

In a further aspect, the present disclosure provides a method for manufacturing an OLED device, including steps of: providing a base substrate; forming an anode on the base substrate; forming a pixel definition layer on the anode, in which the pixel definition layer has a plurality of openings that corresponds to a plurality of light-emitting regions of sub-pixel units respectively; forming a hole injection layer covering the pixel definition layer and the openings; forming a hole transport layer, a light-emitting layer, and an electron transport layer on the regions of the hole injection layer corresponding to the plurality of openings; forming the electron injection layer of the above technical solution on a surface of the electron transport layer by an ink-jet printing method or a spin coating method; and forming a cathode.

Optionally, a hole transport layer, a light-emitting layer, and an electron transport layer are sequentially formed on the regions of the hole injection layer corresponding to the plurality of openings by an ink-jet printing process or a spin coating process.

Optionally, the step of forming the electron injection layer of the above technical solution on the surface of the electron injection layer by an ink-jet printing process includes: dissolving a polymer formed by copolymerizing the unit A and the unit B into an organic solvent, to form an ink having a concentration of 5 to 50 mg/mL, and an Ohnesorge number (1/Oh) value of 1 to 10; and ink-jet printing the ink on the surface of the electron transport layer, followed by heating and drying, to form the electron injection layer.

In another aspect, an embodiment of the present disclosure further provides a display device including the OLED device of the above technical solution.

Optionally, the electron injection layer has a thickness of 0.1 to 20 nm.

Optionally, the cathode is a metal electrode, and a metal-sulfur bond is formed between the electron injection layer and the metal electrode.

DETAILED DESCRIPTION

In order to better understand the present disclosure, embodiments of the present disclosure will be described below in combination with Examples, but it should be understood that these descriptions are merely used to further illustrate the features and advantages of the present disclosure and are not intended to limit the present disclosure.

According to an embodiment of the present disclosure, there is provided a polymer a polymer including a unit A and a unit B, in which the unit A is an aromatic group; and the unit B is a group represented by any of formulae (1) to (6):

(1)

(2)

(3)

(4)

(5)

(6)

the polymer independently includes 1 to 100 the units A and 1 to 100 the units B, and $R_1$ is H or acyloxy, and $R_2$, $R_3$ and $R_4$ are each independently selected from hydrogen, a linear or branched alkyl having 1 to 24 carbon atoms, or a linear or branched alkoxy having 1 to 24 carbon atoms.

Optionally, the unit A is oxazolylene, quinolylidene, anthrylene, diazaanthrylene, pyridylene, thienylene, furylene, pyrrolylene, phenylene, benzopyranylene, benzoxazolylene, benzothylene or isoquinolylene. Optionally, the unit A is a thienylene group. In an embodiment of the present disclosure, the unit A is rich in electrons and has an electron transport function.

In an embodiment of the present disclosure, the unit B is a group represented by any of the formulae (1) to (6). The sulfur atoms in these groups may form metal-sulfurs bond with metal atoms on the surface of the metal electrode. Metal-sulfur bonds are adsorbed on the surface of the metal electrode to form a dense and highly ordered molecular layer. This enhances the compatibility of the metal electrode with the electron injection layer, and achieves the effect of adjusting the surface topography of the electrode interface and adjusting the work function of the electrode, so that the metal electrode and the electron injection layer achieve a desired ohmic contact. In the group represented by any of the formulae (1) to (6), $R_1$ is H or acyloxy. Optionally, $R_1$ may be hydrogen or acetoxy. $R_2$, $R_3$, and $R_4$ may be same or different. Optionally, $R_2$, $R_3$, and $R_4$ are all hydrogen.

Optionally, the unit A and the unit B may form a polymer by alternating copolymerization; or may form a polymer by non-alternating copolymerization.

The polymer according to an embodiment of the present disclosure may be used for forming a film layer by ink-jet printing. When the electron injection layer is made of the polymer, it can be directly produced by ink-jet printing. Therefore, as compared with the related vacuum evaporation process, the preparation method of the present disclosure reduces the manufacturing cost of the OLED devices. Moreover, the unit A in the polymer is rich in electrons and has an electron transport function; and the unit B in the polymer contains a sulfur atom, which can form metal-sulfur bonds with metal atoms on the surface of the metal electrode. Thus, metal-sulfur bonds are adsorbed on the surface of the metal electrode to form a dense and highly ordered molecular layer. This enhances the compatibility of the metal electrode with the electron injection layer, and achieves the effect of adjusting the surface topography of the electrode interface and adjusting the work function of the electrode, so that the metal electrode and the electron injection layer achieve a desired ohmic contact. In addition, this reduces the interface barrier between the cathode and the organic film layer, and improves the ability of electrons to be injected into the organic film layer from the cathode, thereby effectively improving the efficiency of the OLED devices and reducing the driving voltage and power consumption of the OLED devices.

Optionally, the polymer is a polymer as shown by the following formula:

where m is an integer of 1 to 100, and n is an integer of 1 to 100.

According to another embodiment of the present disclosure, there is provided a method for preparing the above polymer, including steps of:

conducting a Suzuki reaction between aromatic dihalide and any of the compounds represented by the following formulae (7) to (12), to achieve the polymer of the above technical solution:

(7)

(8)

(9)

(10)

(11)

(12)

in which the $R_1$ is H or acyloxy; $R_2$, $R_3$ and $R_4$ are each independently selected from hydrogen, a linear or branched alkyl having 1 to 24 carbon atoms, or a linear or branched alkoxy having 1 to 24 carbon atoms; and $R_5$ is a borate group or borate ion.

Optionally, the method for preparing a polymer includes: uniformly mixing aromatic dihalide, any of the compounds represented by the formulae (7) to (12) and a base in a solvent, to conduct a Suzuki reaction under the effect of a palladium catalyst; followed by concentrating and separating to achieve the polymer formed by the alternating copolymerization of the unit A and the unit B.

Optionally, the molar ratio of aromatic dihalide to any of the compounds represented by the formulae (7) to (12) is from 1:1.5 to 1.5:1; further optionally from 1:1.4 to 1.4:1, from 1:1.2 to 1.2:1, from 1:1.1 to 1.1:1 or from 1:1.05 to 1.05:1.

Optionally, in the uniformly mixing aromatic dihalide, any of the compounds represented by the formulae (7) to (12) and the base in a solvent, one or more of any of the compounds represented by the formulae (13) to (18), the aromatic diborate or the aromatic diboronic acid are further added.

in which $R_1$ is H or acyloxy; $R_2$, $R_3$ and $R_4$ are each independently selected from hydrogen, a linear or branched alkyl having 1 to 24 carbon atoms, or a linear or branched alkoxy having 1 to 24 carbon atoms. X is halogen, and optionally X is bromine or iodine.

Optionally, the method for preparing a polymer may further include the steps: conducting a Suzuki reaction between any of the compounds represented by the following formulae (13) to (18) and an aromatic diborate or aromatic diboric acid, to achieve the polymer of the above technical solution.

Optionally, the method for preparing a polymer specifically includes: uniformly mixing any of the compounds represented by the formulae (13) to (18), an aromatic diborate or aromatic diboric acid, and a base in a solvent, to conduct a Suzuki reaction under the effect of a palladium catalyst; followed by concentrating and separating to achieve the polymer of the above technical solution.

Optionally, in the uniformly mixing any of the compounds represented by the formulae (13) to (18), the aromatic diborate or aromatic diboric acid and the base in the solvent, one or more of any of the compounds represented by the formulae (7) to (12) and aromatic dihalide may be further added.

Optionally, the palladium catalyst is a mixture of organopalladium and an organophosphine ligand, for example, tris(dibenzylideneacetone)dipalladium/tris(o-tolyl)phosphine ($Pd_2(dba)_3/P(o)\text{-}Tol)_3$); tetrakis(triphenylphosphine)palladium ($Pd(PPh_3)_4$) or bis(triphenylphosphine)palladium dichloride ($Pd(PPh_3)_2Cl_2$).

Optionally, the base is preferably sodium hydroxide, sodium carbonate, potassium carbonate, sodium hydrogencarbonate or tetraethylammonium hydroxide. The base can maintain the reaction system in an alkaline environment having a pH of not more than 10.

Optionally, the solvent is dichloromethane, chloroform, dioxane, dimethylamide (DMF), dimethyl sulfoxide (DMSO), tetrahydrofuran, 1,2-dimethoxyethane, benzene or toluene.

In the preparation method according to the present disclosure, the reaction system optionally further includes a phase transfer catalyst. Optionally, the phase transfer catalyst is tetrabutylammonium bromide.

In the preparation method according to the present disclosure, the steps of concentrating and separating may be repeated a plurality of times to achieve a pure polymer.

According to an embodiment of the present disclosure, an electron injection layer including the above-described polymer formed by copolymerization of a unit A and a unit B are disclosed. The groups in the unit A and the unit B are the same as described above.

In the electron injection layer according to the present disclosure, forming the electron injection layer with the polymer may not only ensure electron transport function, but also form metal-sulfur bonds between the electron injection layer and the metal electrode, modify the surface of the metal electrode, and enhance compatibility between the metal electrode and the electron injection layer. In addition, the metal-sulfur bond achieves the effect of adjusting the surface topography of the electrode interface and adjusting the work function of the electrode, so that the metal electrode and the electron injection layer achieve a desired ohmic contact.

Moreover, the polymer according to an embodiment of the present disclosure is suitable for forming an electron injection layer by ink-jet printing.

Figure 1:
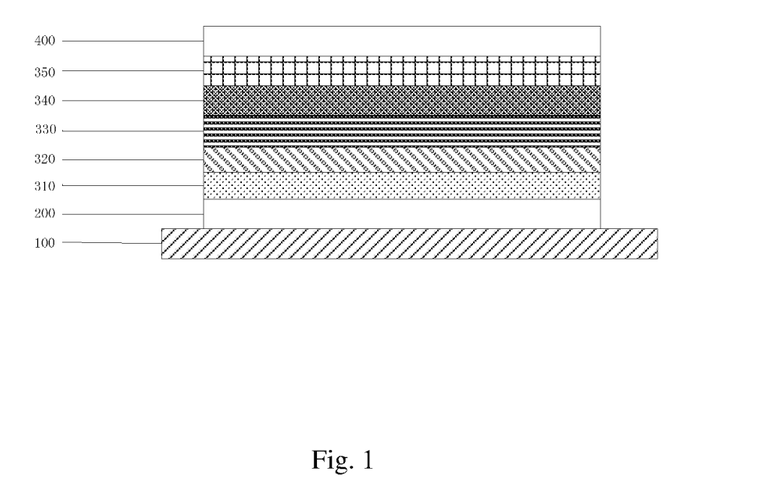
FIG. 1 is a schematic diagram of an OLED device according to an embodiment of the present disclosure.

An OLED device according to an embodiment of the present disclosure includes an anode, a hole injection layer, a hole transport layer, a light-emitting layer, an electron transport layer, the above electron injection layer, and a cathode stacked in sequence. Optionally, as shown in FIG. 1, a specific OLED device according to an embodiment of the present disclosure includes: a base substrate 100, and an anode 200, a hole injection layer 310, a hole transport layer 320, a light-emitting layer 330, an electron transport layer 340, the above electron injection layer 350, and a cathode 400 stacked in sequence on the substrate 100.

Optionally, the cathode is a metal electrode. For example, the cathode may be a magnesium silver alloy electrode. Optionally, the cathode has a thickness of 9 to 25 nm. When the cathode is a metal electrode, a metal-sulfur bond may be formed between the electron injection layer and the metal electrode. Metal-sulfur bonds are adsorbed on the surface of the metal electrode to form a dense and highly ordered molecular layer. This enhances the compatibility of the metal electrode with the electron injection layer, and achieves the effect of adjusting the surface topography of the electrode interface and adjusting the work function of the electrode. Moreover, this achieves a desired ohmic contact between the metal electrode and the electron injection layer, and the purpose of reducing the work function of the cathode surface.

Optionally, the electron injection layer may further contain an electron-rich organic functional group, such as an aromatic group. The organic functional group can form an electron transport channel that transports the injected electrons to an adjacent organic film layer.

Optionally, the electron injection layer formed by the polymer has a LUMO energy level between −2.5 eV and −3.3 eV, even between −2.0 eV and −3.0 eV. The LUMO level in the above range facilitates electron injection.

In view of the interaction between the electron injection layer and the metal electrode, the thickness of the electron injection layer may be 0.1 nm to 20 nm, more preferably 0.1 nm to 5 nm, or further optionally 0.5 nm to 1 nm.

Optionally, the material of the hole injection layer may be poly(3,4-ethylenedioxythiophene)/poly(styrenesulfonate) (PEDOT:PSS). Optionally, the hole injection layer has a thickness of 10 to 30 nm.

Optionally, the material of the hole transport layer is poly(9-vinylcarbazole). Optionally, the hole transport layer has a thickness of 30 to 90 nm.

Optionally, the material of the light-emitting layer may be poly(p-phenylene vinylene) or poly(9,9-dioctylfluorene-2,7-diyl). Optionally, the light-emitting layer has a thickness of 20 to 50 nm.

Optionally, the material of the electron transport layer may be polydioctylfluorene. Optionally, the electron transport layer has a thickness of 20 to 40 nm.

Optionally, the material of the anode may be ITO/Ag/ITO.

Figure 2:
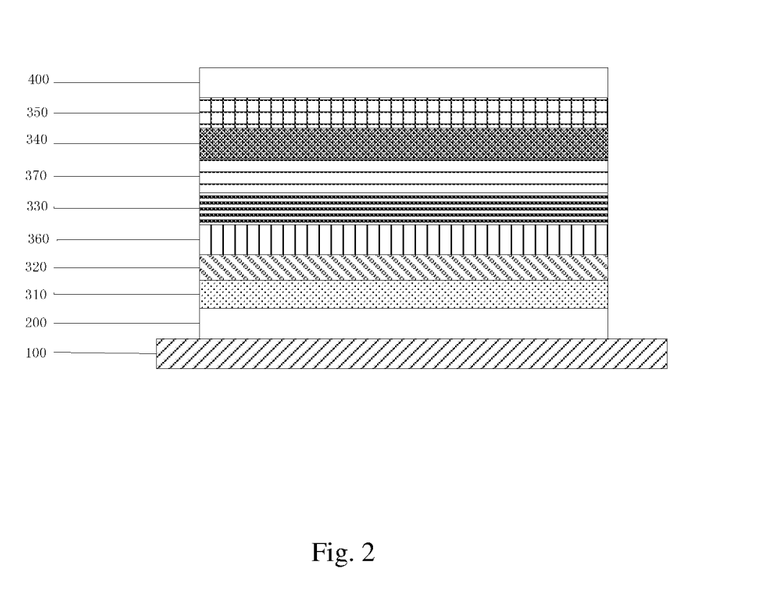
FIG. 2 is a schematic diagram of an OLED device according to another embodiment of the present disclosure.

Optionally, the OLED device further includes an electron stopping layer and/or a hole stopping layer. As shown in FIG. 2, an electron stopping layer 360 is arranged between the hole transport layer 320 and the light-emitting layer 330; and a hole stopping layer 370 is arranged between the light-emitting layer 330 and the electron transport layer 340.

Figure 3:
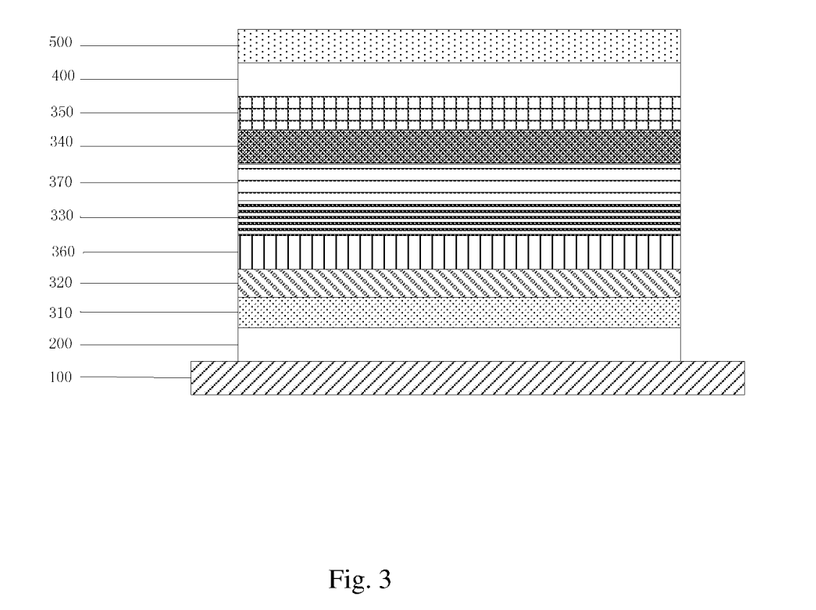
FIG. 3 is a schematic diagram of an OLED device according to a yet embodiment of the present disclosure.

Optionally, the OLED device further includes a light extraction layer. As shown in FIG. 3, a light extraction layer 500 is arranged on a side surface of the cathode 400 facing away from the electron injection layer 350.

The above electron stopping layer, hole stopping layer and light extraction layer are selective film layers, and one or several of the three film layers may be arbitrarily provided.

According to an embodiment of the present disclosure, disclosed is a method for preparing an OLED device, including steps of: providing a base substrate; forming an anode on the base substrate; forming a pixel definition layer on the anode, in which the pixel definition layer has a plurality of openings that corresponds to a plurality of light-emitting regions of sub-pixel units respectively; forming a hole injection layer covering the pixel definition layer and the openings; forming a hole transport layer, a light-emitting layer, and an electron transport layer on the regions of the hole injection layer corresponding to the plurality of openings; forming the above electron injection layer on a surface of the electron transport layer by an ink-jet printing process or a spin coating process; and forming a cathode.

The steps in the method for preparing an OLED device are described below in order.

S1: providing a substrate.

The base substrate may include a rigid substrate or a flexible substrate that serves as a support. Optionally, an array of thin film transistors (TFT) is formed on the substrate; and then a subsequent anode, an organic functional film layer, and a cathode are formed in sequence on the TFT array.

S2: forming an anode on the base substrate.

Optionally, the anode is ITO/Ag/ITO, in which ITO is indium tin oxide. The desired pattern is formed by exposure development, etching, and the like.

S3: forming a pixel definition layer on the anode by an ink-jet printing process, in which the pixel definition layer has a plurality of openings that corresponds to a plurality of light-emitting regions of sub-pixel units respectively. The pixel definition layer can be formed by an ink-jet printing process, and the preparation method is simple.

S4: forming a hole injection layer covering the pixel defining layer and the openings.

S5: forming a hole transport layer, a light-emitting layer, and an electron transport layer on the regions of the hole injection layer corresponding to the plurality of openings. Optionally, a hole transport layer, an electron stopping layer, a light-emitting layer, a hole stopping layer, and an electron transport layer are formed in sequence in the regions of the hole injection layer corresponding to the openings.

In the steps S4 and S5, when each of the organic functional layers is formed, optionally, a hole transport layer, a light-emitting layer, and an electron transport layer are sequentially formed on the regions of the hole injection layer corresponding to the plurality of openings by an ink-jet printing process or a spin coating process, to simplify the preparation process of OLED devices. Likewise, the optionally prepared electron stopping layer and hole stopping layer may also be formed by an ink-jet printing process or a spin coating process.

S6: forming the above electron injection layer on a surface of the electron transport layer by an ink-jet printing process or a spin coating process.

The ink used in the ink-jet printing process or the spin coating process generally has a viscosity of 1 cP to 50 cP. The ink printability is mainly characterized in two physical parameters: surface tension and viscosity. The three parameters of surface tension, inertial force and viscosity play key roles in the ejection and formation of ink-jet print droplet. They are generally described by two dimensionless parameters: Reynolds number and Weber number We (Weber number):

$$Re = \frac{v * \rho * a}{\eta}$$

$$We = \frac{v^2 * \rho * a}{\gamma}$$

$$\gamma = g * d_e^2 * \Delta \rho / H$$

where $v$ is the velocity of the fluid, $\rho$ is the density of the fluid, a is the characteristic constant, $\eta$ is the viscosity of the liquid, $\gamma$ is the surface tension, g is the gravity, $d_e$ is the diameter of the droplet at the widest point, which is also referred as the diameter of the equator, and H is a parameter related to the shape factor S.

The Reynolds number Re represents the ratio of inertial force to viscosity of a fluid. The Weber number We is the ratio of inertial force to surface tension. The speed in these two numbers is eliminated to yields another parameter: Ohnesorge number, which is defined as:

$$Oh = \frac{\sqrt{We}}{Re} = \frac{\eta}{\sqrt{\gamma \rho a}}$$

It can be seen that the Ohnesorge number is only related to fluid, viscosity, surface tension, density and characteristic constant, and the Ohnesorge number is a physical constant suitable for describing droplet formation.

The conditions for stable droplet formation are: $1<1/Oh<10$. when the 1/Oh value is low, the viscosity loss prevents the droplets from being ejected; and when the 1/Oh value is high, a large number of satellite droplets fall along with the main droplet, and the droplet is unstable. Therefore, before ink-jet printing, parameters such as ink concentration, density, surface tension, and viscosity should be adjusted, so that the ink has a 1/Oh value between 1 and 10.

The ability to form a thin film on a solid surface after droplet formation, namely the wettability of the droplets, is also very important for ink-jet printing. The contact angle is generally used to indicate the wettability of the droplets, according to Young's equation:

$$\cos\theta = \frac{\gamma_{sg} - \gamma_{sl}}{\gamma_{lg}}$$

$\gamma_{sg}$, $\gamma_{sl}$ and $\gamma_{lg}$ represent the surface tensions of the solid-gas, solid-liquid and liquid-gas phases, respectively, and $\theta$ represents the contact angle of the liquid to the solid. It is known from the Young's equation:

When $\gamma_{sg}<\gamma_{sl}$, $\cos\theta<0$ ($\theta>90°$), the liquid does not wet the solid surface;

When $\theta=180°$, the liquid does not wet the solid surface at all;

When $0<\gamma_{sg}-\gamma_{sl}<\gamma_{lg}$, $0<\cos\theta<1$ ($0<\theta<90°$), the liquid can wet the solid at this time;

When $\cos\theta=0$ ($\theta=0°$), the liquid completely wets the solid surface.

Therefore, it is necessary to ensure that the ink of the ink-jet printing can form a thin film on the solid substrate, and the closer the contact angle $\theta$ value is to 0, the better it is. In the actual production process, the contact angle of 0 is almost impossible, but it is preferably less than 5°.

According to the above analysis, the forming the electron injection layer on the surface of the electron injection layer by the ink-jet printing method optionally includes: dissolving a polymer formed by alternating copolymerization of the unit A and the unit B into an organic solvent, to form an ink having a concentration of 5 to 50 mg/mL, and an Ohnesorge number (1/Oh) value of 1 to 10; and ink-jet printing the ink on the surface of the electron transport layer, followed by heating and drying, to form the electron injection layer.

S6: forming a cathode.

Optionally, the cathode is a metal electrode, such as a Mg:Ag alloy. Optionally, the ratio of Mg:Ag alloy is from 1:15 to 15:1.

Optionally, after the cathode is formed, a light extraction layer is evaporated on the cathode. The material of the light extraction layer may be selected from N,N'-diphenyl-N,N'-bis(1-naphthyl)-1,1'-biphenyl-4,4'-diamine (NPB). Optionally, the thickness of the light extraction layer can be 50 nm to 80 nm.

According to an embodiment of the present disclosure, a display device including the above OLED device is also disclosed. The display device may include any product or component having a display function, such as a television, a display, a digital photo frame, a mobile phone, and a tablet computer.

EXAMPLES

In order to further understand the present disclosure, the polymer, the method for preparing the same, the electron injection layer, the OLED device, and the display device provided by the present disclosure will be described detailedly in the following Examples, but the protection scope of the present disclosure is not limited by the following specific Examples.

Example 1

1. Synthesis of Monomer
benzenethiol-2,5-di(cyclopropane borate)

2,5-dibromobenzenethiol (2.66 g, 10 mmol) was weighed and placed in a reaction flask, and an anhydrous tetrahydrofuran solution was added under a nitrogen atmosphere. The reaction flask was placed in a dry ice and acetone bath, and after the temperature was lowered to −78° C., a n-hexane solution of n-butyl lithium (1.6 M, 7.2 ml, 12 mmol) was slowly added dropwise thereto. After reacting for 45 minutes, trimethyl borate (2.75 g, 26.7 mmol) was injected with a syringe. The reaction solution was then gradually warmed to room temperature and stirred for 12 hours. After the reaction of the raw materials was completed, the reaction system was placed in an ice water bath to be lowered to 0° C., stirred, and added slowly dropwise with a dilute sulfuric acid solution (2 N, 50 ml), and the stirring was stopped after the dropwise addition was completed. At this time, the reaction system was divided into two phases of water and oil. The oil phase was separated, and the aqueous phase was extracted with 75 mL of diethyl ether. The obtained organic solution was washed twice with saturated brine (50 ml) and dried over anhydrous magnesium sulfate, and then solid was removed. The obtained filtrate was subjected to removal of most of the solvent by a rotary evaporator, to give a crude product. Then, it was purified by column chromatography, and a mixed solvent of n-hexane and ethyl acetate (3:1 by volume) was used as an eluent. The solid product obtained by purification is benzenethiol-2,5-diboronic acid. 1.98 g (10 mmol) of benzenethiol-2,5-diboronic acid was weighed and dissolved in a 30 ml of toluene solution. A 12 mmol of propylene glycol solution was injected into the syringe. After refluxing for 2-4 hours, the oil phase was separated, and the aqueous phase was extracted with ethyl acetate (75 ml). The obtained organic solution was washed twice with saturated brine (50 ml) and dried over anhydrous magnesium sulfate. After drying, the obtained filtrate was subjected to removal of most of the solvent by a rotary evaporator to give a crude product. Then, the crude product was purified by column chromatography eluting with a mixed solvent of n-hexane and ethyl acetate (3:1 by volume). The solid product obtained by purification is benzenethiol-2,5-di(cyclopropane borate).

Upon nuclear magnetic analysis: $^1$H NMR (400 MHz, CDCl$_3$): δ=7.18-7.26 (1H, ArH), 7.1-7.26 (1H, ArH), 7.0-7.2 (1H, ArH), 3.66-3.89 (8H, CH$_2$), 2.9-3.22 (4H, CH$_2$), 1.71 (1H, SH). 13C NMR (400 MHz, CDCl$_3$): δ=134.2, 132.8, 132.3, 130.7, 129.6, 128.9, 61.6, 38.4; and mass spectrometry: MS (MALDI-TOF) [m/z]: 278, the product was confirmed to be benzenethiol-2,5-di(cyclopropane borate).

The equation for this reaction is shown as follows:

2. Synthesis of Polymers

M1 mol of 2,5-dibromobenzenethiol, M2 mol of benzenethiol-2,5-di(cyclopropane borate) and N mol of 2,5-diiodothiophene were weighed and place into a reaction flask, and added with a small amount of tetrakis(triphenylphosphine)palladium. A layer of aluminum foil was wrapped around the reaction device to protect the reaction system from light. Vacuuming—filling with nitrogen—vacuuming by a double-row tube was repeated for three times, and finally the reaction system was protected with nitrogen. Then, a toluene solution obtained by treatment with a nanowire and distillation and 2 M of an aqueous potassium carbonate solution (in volume ratio of aqueous solution to toluene of 3:2, and containing a small amount of phase transfer catalyst tetrabutylammonium bromide) were added. The reaction mixture was reacted at 80° C. to 90° C. for 72 hours with vigorous stirring and then capped with bromobenzene. It was then cooled to room temperature, washed with water and then concentrated on a rotary evaporator. The concentrated solution was slowly added dropwise to a rapidly stirred mixture of methanol and water (200 ml, volume ratio of 10:1), to give a fibrous product. After the dropwise addition was completed, stirring was continued for 2 to 3 hours, followed by filtration. The fibrous solid was collected. Then, the obtained solid was dissolved in tetrahydrofuran and concentrated again, and the concentrate was slowly added dropwise to 200 ml of methanol, to precipitate a fibrous solid. After the dropwise addition was completed, stirring was continued for 2 to 3 hours, and then the solid collected by filtration was extracted with acetone by a Soxhlet extractor for 3 days. The solid powder was collected and dried in vacuum for 24 hours.

The synthesized polymer has the following general formula:

Nuclear magnetic analysis: $^1$H NMR (CDCl$_3$, 400 MHz): 7.45 (s, 1H), 7.28-7.31 (br, 2H), 7.13 (s, 1H), 6.83 (s, 1H), 3.4 (s, 1H); $^{13}$CNMR (400 MHz, CDCl$_3$, ppm): δ 142.0, 136, 134.3, 133.7, 131.0, 129.8, 127.6, 127.5, 127.4, 126.4.

Example 2

1. A substrate (both rigid and flexible) having a thin film transistor array required for driving and compensating the OLED thereon was provided. A metal anode ITO/Ag/ITO was prepared on the array substrate. The desired pattern is formed by exposure development, etching, and the like. There was also an ink-jet printed pixel-definition layer above the anode.

2. A hole injection layer, a hole transporting layer, a light-emitting layer, an electron transport layer, and an electron injection layer was formed by spin coating or ink-jet printing.

a) An anode modification layer, that is, a hole injection layer, was formed by a spin coating process. The hole injection layer was a PEDOT:PSS film, which had the advantages of high electrical conductivity, good environmental stability, and high transmittance. The main function was to modify the ITO anode, reduce the probability of short circuit of the device and reduce the turn-on voltage of the OLED, etc. The film was prepared in the following manner: an aqueous solution of PEDOT:PSS was dropped on the substrate in a room temperature atmosphere; a spin coater was started, in which the rotational speed of the spin coating is 3000 to 5000 rpm; and, after the coating was completed, the substrate was transferred onto a heating table for heating at a temperature of 80 to 150° C. for about 1 to 30 minutes, thereby achieving a film having a thickness of about 10 to 30 nm. In order to prevent uneven heating, large-sized substrates are generally heat-treated in a vacuum oven, the purpose of which is to remove the residual moisture from the film layer and crosslink the cured PEDOT:PSS film.

b) The hole transport layer was prepared by spin coating. The material used for the hole transport layer was p-vinylcarbazole (PVK). In order to prevent the material from being attacked by water and oxygen, the PVK film was prepared by spin coating in a nitrogen atmosphere. The thickness of the PVK film was controlled by the concentration and rotation speed of the PVK chlorobenzene solution. After the coating was completed, the substrate was transferred onto a heating table for heating at a temperature of 80 to 150° C. for about 1 to 30 minutes, thereby achieving a film having a thickness of about 30 to 90 nm.

c) The light-emitting layer was prepared by ink-jet printing. The material used for the light-emitting layer was poly(p-phenylene vinylene). Before the printing, the temperature of the printing chamber should be maintained at 25±2° C., to adjust the concentration, viscosity and surface tension of the poly(p-phenylene vinylene) solution, that is, the general solution solubility is 5 to 50 mg/ml, such it has 1/Oh value of 1 to 10 to allow the ink-jet printing. After the printing was completed, the film was transferred to a vacuum chamber for heating and drying, so that the solvent remaining in the thin film was completely volatilized, and the time for heating and drying was 1 to 30 minutes, to achieve a light-emitting layer film having a thickness of 20 to 50 nm.

d) An electron transport layer was ink-jet printed. The material used for the electron transport layer was polydioctylfluorene and has a thickness of 20 to 40 nm. The printing process is similar to the light-emitting layer and will not be described here.

e) The polymer prepared in Example 1 was dissolved in an organic solvent to form an ink having a concentration of 5 to 50 mg/ml. The ink has a 1/Oh value of 1 to 10. Ink-jet printing is performed, and after the printing was completed, the film was transferred to a vacuum chamber for heating and drying, so that the solvent remaining in the thin film was completely volatilized, and the time for heating and drying was 1 to 30 minutes, to achieve an electron injection layer thin film having a thickness of 0.1 to 20 nm.

3. In a vacuum environment (vacuum degree of $10^{-6}$ Pa), a layer of Mg:Ag alloy having a thickness of 12 to 25 nm was deposited as a cathode, and the ratio of Mg:Ag was between 1:15 and 15:1. Finally, a layer of NPB was deposited on the cathode as a light extraction layer having a thickness of 50 to 70 nm, to prepare an OLED device.

Figure 4:
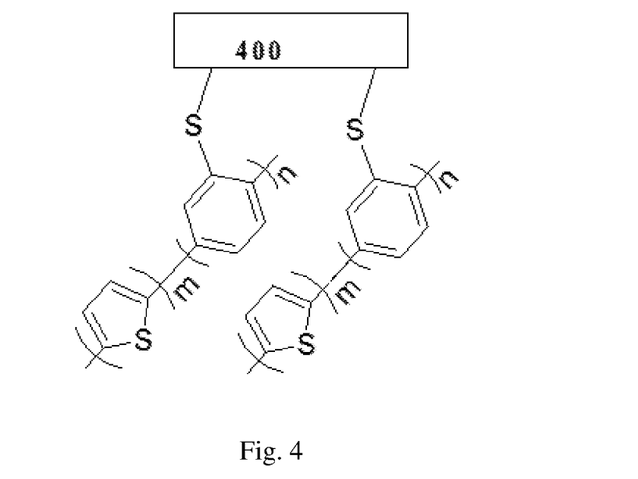
FIG. 4 is a schematic diagram showing the structure between the electron injection layer and the cathode according to a further embodiment of the present disclosure.

Referring to FIG. 4, the electron injection layer formed a chemical bond with the cathode. After testing, the work function of the cathode dropped by about 0.3 to 0.5 eV.

Example 3 m mol of benzenethiol-2,5-di(cyclopropane borate) and n mol of 2,5-diiodothiophene were weighed and placed in a reaction flask, and added with a small amount of tetrakis (triphenylphosphine)palladium. A layer of aluminum foil was wrapped around the reaction device to protect the reaction system from light. Vacuuming—filling with nitrogen—vacuuming by a double-row tube was repeated for three times, and finally the reaction system was protected with nitrogen. Then, a toluene solution obtained by treatment with a nanowire and distillation and 2 M of an aqueous potassium carbonate solution (in volume ratio of aqueous solution to toluene of 3:2, and containing a small amount of phase transfer catalyst tetrabutylammonium bromide) were added. The reaction mixture was reacted at 80° C. to 90° C. for 72 hours with vigorous stirring and then capped with bromobenzene. It was then cooled to room temperature, washed with water and then concentrated on a rotary evaporator. The concentrated solution was slowly added dropwise to a rapidly stirred mixture of methanol and water (200 ml, volume ratio of 10:1), to give a fibrous product. After the dropwise addition was completed, a fibrous solid was collected. Then, the obtained solid was dissolved in tetrahydrofuran and concentrated again, and the concentrate was slowly added dropwise to 200 ml of methanol, to precipitate a fibrous solid. After the dropwise addition was completed, stirring was continued for 2 to 3 hours, and then the solid collected by filtration was extracted with acetone by a Soxhlet extractor for 3 days. The solid powder was collected and dried in vacuum for 24 hours.

Upon nuclear magnetic analysis, the synthesized polymer was an alternating copolymer of Example 4

1. A substrate (both rigid and flexible) having a thin film transistor array required for driving and compensating the OLED thereon was provided. A metal anode ITO/Ag/ITO was prepared on the array substrate. The desired pattern is formed by exposure development, etching, and the like. There was also an ink-jet printed pixel-definition layer above the anode.

2. A hole injection layer, a hole transporting layer, a light-emitting layer, an electron transport layer, and an electron injection layer was formed by spin coating or ink-jet printing.

a) An anode modification layer, that is, a hole injection layer, was formed by a spin coating method. The hole injection layer was a PEDOT:PSS film, which had the advantages of high electrical conductivity, good environmental stability, and high transmittance. The main function was to modify the ITO anode, reduce the probability of short circuit of the device and reduce the turn-on voltage of the OLED, etc. The film was prepared in the following manner: an aqueous solution of PEDOT:PSS was dropped on the substrate in a room temperature atmosphere; a spin coater was started, in which the rotational speed of the spin coating is 3000 to 5000 rpm; and, after the coating was completed, the substrate was transferred onto a heating table for heating at a temperature of 80 to 150° C. for about 1 to 30 minutes, thereby achieving a film having a thickness of about 10 to 30 nm. In order to prevent uneven heating, large-sized substrates are generally heat-treated in a vacuum oven, the purpose of which is to remove the residual moisture from the film layer and crosslink the cured PEDOT:PSS film.

b) The hole transport layer was prepared by spin coating. The material used for the hole transport layer was p-vinylcarbazole (PVK). In order to prevent the material from being attacked by water and oxygen, the PVK film was prepared by spin coating in a nitrogen atmosphere. The thickness of the PVK film was controlled by the concentration and rotation speed of the PVK chlorobenzene solution. After the coating was completed, the substrate was transferred onto a heating table for heating at a temperature of 80 to 150° C. for about 1 to 30 minutes, thereby achieving a film having a thickness of about 30 to 90 nm.

c) The light-emitting layer was prepared by ink-jet printing. The material used for the light-emitting layer was poly(p-phenylene vinylene). Before the printing, the temperature of the printing chamber should be maintained at 25±2° C., to adjust the concentration, viscosity and surface tension of the poly(p-phenylene vinylene) solution, that is, the general solution solubility is 5 to 50 mg/ml, such it has 1/Oh value of 1 to 10 to allow the ink-jet printing. After the printing was completed, the film was transferred to a vacuum chamber for heating and drying, so that the solvent remaining in the thin film was completely volatilized, and the time for heating and drying was 1 to 30 minutes, to achieve a light-emitting layer film having a thickness of 20 to 50 nm.

d) An electron transport layer was ink-jet printed. The material used for the electron transport layer was polydioctylfluorene and has a thickness of 20 to 40 nm. The printing process is similar to the light-emitting layer and will not be described here.

e) The polymer prepared in Example 3 was dissolved in an organic solvent to form an ink having a concentration of 5 to 50 mg/ml. The ink has a 1/Oh value of 1 to 10. Ink-jet printing is performed, and after the printing was completed, the film was transferred to a vacuum chamber for heating and drying, so that the solvent remaining in the thin film was completely volatilized, and the time for heating and drying was 1 to 30 minutes, to achieve an electron injection layer thin film having a thickness of 0.1 to 20 nm.

3. In a vacuum environment (vacuum degree of $10^{-6}$ Pa), a layer of Mg:Ag alloy having a thickness of 12 to 25 nm was deposited as a cathode, and the ratio of Mg:Ag was between 1:15 and 15:1. Finally, a layer of NPB was deposited on the cathode as a light extraction layer having a thickness of 50 to 70 nm, to prepare an OLED device.

After testing, the work function of the cathode dropped by about 0.3 to 0.5 eV.

The description of the above Examples is merely used for helping to understand the method according to the present disclosure and its inventive concept. It should be noted that a person skilled in the art may make further improvements and modifications to the disclosure without departing from the principle/spirit of the present disclosure, and these improvements and modifications shall also fall within the scope of the present disclosure.

What is claimed is:

1. A polymer consisting of a unit A and a unit B and used in an electron transport layer of an organic light-emitting diode device, wherein the unit A is theinylene; and the unit B is a group represented by any of formulae (1) to (6):

(1)

(2)

(3)

(4)

(5)

(6)

the polymer independently comprises 1 to 100 the units A and 1 to 100 the units B, and $R_1$ is H or acyloxy, and $R_2$, $R_3$ and $R_4$ are each independently selected from hydrogen, a linear or branched alkyl having 1 to 24 carbon atoms, or a linear or branched alkoxy having 1 to 24 carbon atoms.

2. The polymer of claim 1, wherein $R_1$, $R_2$, $R_3$ and $R_4$ are all hydrogen.

3. A method for preparing the polymer of claim 1, comprising:

conducting a Suzuki reaction between aromatic dihalide and any of compounds represented by the following formulae (7) to (12), to achieve the polymer of claim 1; or conducting a Suzuki reaction between any of compounds represented by the following formulae (13) to (18) and an aromatic diborate or aromatic diboric acid, to achieve the polymer of claim 1,

(7)

(8)

-continued (9)

(10)

(11)

(12)

(13)

(14)

(15)

(16)

(17)

(18)

wherein $R_1$ is H or acyloxy; $R_2$, $R_3$ and $R_4$ are each independently selected from hydrogen, a linear or branched alkyl having 1 to 24 carbon atoms, or a linear or branched alkoxy having 1 to 24 carbon atoms; $R_5$ is a borate group or borate ion; and X is halogen.

4. The method of claim 3, wherein the steps comprise:
uniformly mixing aromatic dihalide, any of the compounds represented by the formulae (7) to (12) and a base in a solvent, to conduct a Suzuki reaction under the effect of a palladium catalyst; followed by concentrating and separating to achieve the polymer of claim 1; or
uniformly mixing any of the compounds represented by the formulae (13) to (18), an aromatic diborate or aromatic diboric acid, and a base in a solvent, to conduct a Suzuki reaction under the effect of a palladium catalyst; followed by concentrating and separating to achieve the polymer of claim 1.

5. The method of claim 4, wherein in the step of uniformly mixing aromatic dihalide, any of the compounds represented by the formulae (7) to (12) and the base in a solvent, one or more of any of the compounds represented by the formulae (13) to (18), the aromatic diborate and the aromatic diboronic acid are further added.

6. The method of claim 4, wherein in the step of uniformly mixing any of the compounds represented by the formulae (13) to (18), the aromatic diborate or the aromatic diboric acid and the base in the solvent, one or more of the compounds represented by the formulae (7) to (12) and aromatic dihalide are further added.

7. An electron injection layer, comprising the polymer of claim 1.

8. The electron injection layer of claim 7, wherein $R_1$, $R_2$, $R_3$ and $R_4$ are all hydrogen.

9. An organic light-emitting diode (OLED) device, comprising an anode, a hole injection layer, a hole transport layer, a light-emitting layer, an electron transport layer, the electron injection layer of claim 7, and a cathode stacked in sequence.

10. The OLED device of claim 9, wherein the electron injection layer has a thickness of 0.1 to 20 nm.

11. The OLED device of claim 9, wherein the cathode is a metal electrode, and a metal-sulfur bond is formed between the electron injection layer and the metal electrode.

12. A method for manufacturing the OLED device of claim 9, comprising:
providing a base substrate;
forming an anode on the base substrate;
forming a pixel definition layer on the anode, wherein the pixel definition layer has a plurality of openings that corresponds to a plurality of light-emitting regions of sub-pixel units respectively;

forming a hole injection layer covering the pixel definition layer and the openings;

forming a hole transport layer, a light-emitting layer, and an electron transport layer on regions of the hole injection layer corresponding to the plurality of openings;

forming the electron injection layer of claim 8 on a surface of the electron transport layer by an ink-jet printing process or a spin coating process; and forming a cathode.

13. The method of claim 12, wherein a hole transport layer, a light-emitting layer, and an electron transport layer are sequentially formed on the regions of the hole injection layer corresponding to the plurality of openings by an ink-jet printing process or a spin coating process.

14. The method of claim 13, wherein the step of forming the electron injection layer on the surface of the electron transport layer by an ink-jet printing process comprises:

dissolving a polymer formed by copolymerizing the unit A and the unit B into an organic solvent, to form an ink having a concentration of 5 to 50 mg/mL, and an Ohnesorge number (1/Oh) value of 1 to 10; and ink-jet printing the ink on the surface of the electron transport layer, followed by heating and drying, to form the electron injection layer.

15. A display device, comprising the OLED device of claim 9.

16. The display device of claim 15, wherein the electron injection layer has a thickness of 0.1 to 20 nm.

17. The display device of claim 15, wherein the cathode is a metal electrode, and a metal-sulfur bond is formed between the electron injection layer and the metal electrode.

* * * * *